US012617034B2

(12) United States Patent
Dahl et al.

(10) Patent No.: US 12,617,034 B2
(45) Date of Patent: May 5, 2026

(54) METHOD OF MAKING A TOOL

(71) Applicant: AB SANDVIK COROMANT, Sandviken (SE)

(72) Inventors: Leif Dahl, Sandviken (SE); Tim Ulitzka, Sandviken (SE)

(73) Assignee: AB Sandvik Coromant, Sandviken (SE)

( * ) Notice: Subject to any disclaimer, the term of this patent is extended or adjusted under 35 U.S.C. 154(b) by 0 days.

(21) Appl. No.: 18/683,808

(22) PCT Filed: Aug. 15, 2022

(86) PCT No.: PCT/EP2022/072751
§ 371 (c)(1),
(2) Date: Feb. 15, 2024

(87) PCT Pub. No.: WO2023/020986
PCT Pub. Date: Feb. 23, 2023

(65) Prior Publication Data
US 2024/0367248 A1 Nov. 7, 2024

(30) Foreign Application Priority Data

Aug. 16, 2021 (SE) .................................... 2130220-3
Nov. 3, 2021 (EP) .................................... 21206226

(51) Int. Cl.
B23K 1/00 (2006.01)
B23K 1/008 (2006.01)
(Continued)

(52) U.S. Cl.
CPC ............ B23K 1/0008 (2013.01); B23K 1/008 (2013.01); B23K 31/02 (2013.01); C22C 29/067 (2013.01);
(Continued)

(58) Field of Classification Search
CPC ........ B23K 1/0008; B23K 1/008; B23K 1/19; B23K 1/20; B23K 2103/52; C22C 38/105
See application file for complete search history.

(56) References Cited

U.S. PATENT DOCUMENTS 3,132,937 A * 5/1964 Sadowski ............... C22C 38/12
420/95
3,262,777 A * 7/1966 Sadowski ............... C22C 38/44
148/621
(Continued)

FOREIGN PATENT DOCUMENTS

| CN | 109514017 A | 3/2019 |
| JP | H05177344 A | 7/1993 |
| JP | 2000042756 A | 2/2000 |

OTHER PUBLICATIONS

Amelzadeh Mohammadreza et al: "Dissmiliar vaccum brazing of cemented carbide to steel using double-layer filler metals", Journal of Manufacturing Processes, Society of Manufacturing Engineers, Dearborn, MI, US. vol 47, Sep. 28, 2019, pp. 1-9.

*Primary Examiner* — Erin B Saad
(74) *Attorney, Agent, or Firm* — Corinne R. Gorski

(57) ABSTRACT

A method of making a tool having a joining a maraging steel joining partner and a cemented carbide joining partner by brazing and a tool made according to the method is provided. The method includes depositing a Ni coating onto the maraging steel joining partner prior to applying the filler material having at least 70 wt % Cu. The braze joint shows excellent shear strength.

8 Claims, 2 Drawing Sheets

(51) Int. Cl.

| | |
|---|---|
| *B23K 31/02* | (2006.01) |
| *C22C 29/06* | (2006.01) |
| *C22C 29/08* | (2006.01) |
| *C22C 38/06* | (2006.01) |
| *C22C 38/10* | (2006.01) |
| *C22C 38/12* | (2006.01) |
| *C22C 38/14* | (2006.01) |
| *C22C 38/44* | (2006.01) |
| *C22C 38/50* | (2006.01) |
| *C22C 38/52* | (2006.01) |
| *C23C 14/16* | (2006.01) |
| *B23K 101/20* | (2006.01) |
| *B23K 103/00* | (2006.01) |
| *B23K 103/18* | (2006.01) |

(52) U.S. Cl.

CPC .............. *C22C 29/08* (2013.01); *C22C 38/06* (2013.01); *C22C 38/105* (2013.01); *C22C 38/12* (2013.01); *C22C 38/14* (2013.01); *C22C 38/44* (2013.01); *C22C 38/50* (2013.01); *C22C 38/52* (2013.01); *C23C 14/16* (2013.01); *B23K 2101/20* (2018.08); *B23K 2103/18* (2018.08); *B23K 2103/50* (2018.08)

(56) References Cited

U.S. PATENT DOCUMENTS

| | | | | |
|---|---|---|---|---|
| 3,313,662 A | * | 4/1967 | Malagari, Jr. ......... | C22C 38/105 |
| | | | | 420/95 |
| 4,357,299 A | * | 11/1982 | Pattanaik ............. | B23K 35/302 |
| | | | | 228/122.1 |
| 2004/0258944 A1 | * | 12/2004 | Oles ........................ | B23P 15/28 |
| | | | | 428/617 |
| 2005/0271890 A1 | * | 12/2005 | Koecher .............. | B23K 35/327 |
| | | | | 428/615 |
| 2017/0173717 A1 | * | 6/2017 | Ther ...................... | B22F 3/004 |
| 2018/0038167 A1 | * | 2/2018 | Xu .......................... | B28B 1/001 |

* cited by examiner

METHOD OF MAKING A TOOL

RELATED APPLICATION DATA

This application is a § 371 National Stage Application of PCT International Application No. PCT/EP2022/072751 filed Aug. 15, 2022 with priority to SE 2130220-3 filed Aug. 16, 2021 and EP 21206226.9 filed Nov. 3, 2021.

TECHNICAL FIELD

The present invention relates to a method of making a tool comprising a joining a maraging steel joining partner and a cemented carbide joining partner by brazing. The present invention also relates to a tool made according to this method.

BACKGROUND

Joining steel with cemented carbide by brazing or welding has been known for a long time in the art of making tools. There are several challenges when joining steel with cemented carbide, e.g. differences in CTE (coefficient of thermal expansion), strength of the braze joint, undesired hardness profiles in the steel etc.

There are several solutions that can improve each of these problems individually, but the solutions often result in problems in other areas and not all problems can be solved.

The principle of brazing is that you use a filler material that joins two pieces when heated. There are several ways to heat the braze joint, where one of the most common way is induction heating using an induction coil. One of the benefits with using a coil is that only the local area around the braze joint is heated and leaving the rest of the tool unaffected. This local heating can however lead to unwanted hardness profiles in the steel part which can cause problems when the steel part will be provided with threading etc., for fastening rotary tools and other cutting tools etc.

SUMMARY

One object of the present invention is to provide a tool which have both a strong braze joint and a steel part with an even hardness profile and a high hardness and consequently an improved wear resistance.

Another object of the present invention is to provide a process of joining steel and cemented carbide which is easy to use and lead to a predictable joint with high strength and a steel part that has a predictable hardness.

The present invention relates to a method of making a tool by joining a cemented carbide joining partner with a maraging steel joining partner comprising the steps of:

- applying a Ni coating with a thickness of between 0.5 and 15 μm on a joining surface of the maraging steel joining partner;
- placing a filler material comprising at least 70 wt % Cu in contact with the cemented carbide joining partner and the joining surface of the maraging steel joining partner;
- subjecting the cemented carbide joining partner and the maraging joining partner with the filler material in between to an elevated temperature in a vacuum furnace at a temperature between 90° and 1200° C., for a time period of between 1 and 60 minutes;
- subjecting the joined cemented carbide joining partner and maraging joining partner to a tempering process at a temperature of between 30° and 600° C. for between 5 minutes and 12 hours.

Maraging steel is a type of steel, which is hardened by precipitation of intermetallic compounds. Maraging steels suitably contains from 8 to 25 wt % Ni and one or more alloying elements selected from Co, Mo, Ti, Al and Cr in a total amount of between 7 to 27 wt %, preferably between 7 to 23 wt % of alloying elements. Maraging steels typically contain less carbon than conventional steel, suitably 0.03 wt % or less. The balance being Fe and impurities.

In one embodiment of the present invention, the maraging steel according to the present invention contains from 11 to 25 wt % Ni, preferably 15 to 25 wt % Ni. The alloying elements are suitably Co in an amount of from 7 to 15 wt %, preferably 8.5 to 12.5 wt % Co, Mo in an amount of from 3 to 10 wt %, preferably 3 to 6 wt % Mo, Ti in an amount of from 0.1 to 1.6 wt %, preferably from 0.5 to 1.2 wt % Ti, from 0 to 0.15 wt % Cr, Al in an amount of from 0 to 0.2 wt % and less than 0.03 wt % C. The balance being Fe and impurities.

In one embodiment of the present invention, the maraging steel has a composition of from 17 to 19 wt % Ni, from 8.5 to 12.5 wt % Co, from 4 to 6 wt % Mo, from 0.5 to 1.2 wt % Ti, from 0 to 0.15 wt % Cr, from 0 to 0.2 wt % Al and less than 0.03 wt % C. The balance being Fe and impurities.

By impurities is herein meant any element that can be present in the maraging steel in such small amounts that it does not have any influence on the properties of the steel. The total amount of impurities is below 0.50 wt %, preferably below 0.15 wt %. Examples of such elements are Mn, P, Si, B and S.

In one embodiment of the present invention, the amount of Mn is less than 0.05 wt %, the amount of P is less than 0.003 wt %, the amount of Si is less than 0.004 wt % and the amount of S less than 0.002 wt %.

The Ni coating can be deposited using any coating technique known in the art of depositing Ni coatings, e.g., galvanization or PVD. The thickness of the Ni coating is between 0.5 and 20 μm, preferably between 2 and 10 μm.

In one embodiment of the present invention, the Ni coating is deposited using PVD comprising the steps of first cleaning the steel surface by ion etching prior to depositing the Ni coating. The exact process parameters are to be determined by the person skilled in the art depending on what type of depositing equipment that is to be used.

The cemented carbide joining partner can be made of any cemented carbide common in the art. The cemented carbide comprises a hard phase embedded in a metallic binder phase matrix.

By cemented carbide is herein meant that at least 50 wt %, suitably at least 70 wt %, of the hard phase is WC.

Suitably, the amount of metallic binder phase is between 3 and 20 wt %, preferably between 4 and 15 wt % of the cemented carbide. Preferably, the main component of the metallic binder phase is selected from one or more of Co, Ni and Fe, more preferably the main component of the metallic binder phase is Co.

By main component is herein meant that no other elements are added to form the binder phase, however, if other components are added, like e.g., Cr, they will inevitably be dissolved in the binder during sintering.

In one embodiment of the present invention, the cemented carbide can also comprise other components common in cemented carbides elements selected from Cr, Ta, Ti, Nb and V present as elements or as carbides, nitrides or carbonitrides.

The filler material (sometimes also called braze material) according to the present invention contains at least 70 wt % Cu, preferably at least 80 wt % Cu. The remaining elements could be e.g., Ge, Mn, Ni, Sn, Ag, to adjust melting temperature and wetting to the materials to be joined.

In one embodiment of the present invention the filler material is at least 99 wt % Cu.

Suitably, the filler material is provided as a foil or wire.

The filler material is provided onto the joining surfaces of the cemented carbide substrate and the steel part.

The thickness of the filler material prior to the brazing process depends on the type of material, i.e., foil or wire. Typically, the thickness of a foil is between 5 and 200 µm, preferably between 15 and 100 µm.

The cemented carbide joining partner and the maraging joining partner with the filler material in between is then subjected to an elevated temperature by placing the parts in a furnace with an inert or reducing environment, i.e., with minimum amount of oxygen. Preferably, the brazing temperature in the furnace is between 90° and 1200° C., preferably between 95° and 1170° C. more preferably between 100° and 1150° C. The time the parts are subjected to the elevated temperature is between 1 and 60 minutes, preferably between 5 and 30 minutes. If the time at elevated temperature is shorter, there is not enough time for the braze joint to form and the desired strength of the braze joint is not reached. If the time at elevated temperature is longer it can have a negative effect on the steel properties.

Suitably the cooling rate from the brazing temperature down to a temperature at least below the solidus temperature of the filler material, preferably below 300° C., is between 1 to 50° C./min, preferably is between 3 to 10° C./min.

The brazing suitably takes place in vacuum or with the presence of Argon at low partial pressure. By vacuum is herein meant that the pressure in the furnace is below $5 \times 10^{-4}$ mbar, preferably below $5 \times 10^{-5}$ mbar. If argon is present, the argon pressure is below $1 \times 10^{-2}$ mbar.

After brazing, the parts are subjected to an aging step by subjecting the parts to an elevated aging temperature of between 300 and 600° C., preferably between 40° and 600° C. and most preferably between 50° and 600° C., for a time of between 5 minutes and 12 hours, preferably between 2 and 5 hours.

Suitably the heating rate up to the aging temperature is between 1 to 50° C./min, preferably is between 5 to 10° C./min. Suitably the cooling rate from the aging temperature down to a temperature of preferably below 300° C., is between 1 to 50° C./min, preferably is between 5 to 10° C./min.

The brazing furnace used according to the present invention can be any furnace that can provide such well controlled conditions with regard to a vacuum, heating and cooling rate etc. as has been described above. The brazing and aging steps can either be done in the same furnace or in two separate furnaces.

In one embodiment of the present invention, the aging takes place directly after the brazing step in the same furnace as the brazing step takes place.

In one embodiment of the present invention, the aging takes place directly after the brazing step in a different furnace from the vacuum brazing.

In one embodiment of the present invention, the aging takes place in the same furnace/deposition chamber before or during deposition of a coating.

The tool can be any tool or part of a tool common in the art where a cemented carbide part is joined with a steel part by brazing. Examples are drills, end mills, tool holders like shanks etc.

In one embodiment of the present invention, the tool is a shank used as a tool holder for a cutting tool like an insert, drill head etc. The shank is formed by a cemented carbide part and a steel part, where the cemented carbide part is used to create stability and the steel part is necessary to create threading to fasten a cutting tool.

The present invention also relates to a tool made according to the method above. The tool comprises a maraging steel joining partner and a cemented carbide joining partner and a braze joint joining said joining partners.

By braze joint is herein meant the area or mass between the cemented carbide joining partner and the maraging steel joining partner that is filled by the filler material and formed during the brazing process.

The thickness of the braze joint is suitably between 5 and 200 µm, preferably between 15 and 100 µm.

The braze joint has a shear strength of at least 200 MPa, preferably at least 250 MPa.

The brazing joint comprises Cu and most likely some Ni. The Ni coating is extremely difficult to detect after the brazing step. Since the maraging steel joining member also contains considerable amounts of Ni it cannot be determined where any detected Ni comes from. The effect of the Ni coating is however obvious when the shear strength of the braze joint is measured.

The average hardness of the maraging steel part is suitably between 350 and 600 HV1, preferably between 400 and 460 HV1 and more preferably 410 to 450 HV1. The hardness is measured by a Vickers hardness tester, applying a load of 1 kgf (kilogram force) and a loading time of 15 s. A pattern of 3×6 indents in the full material (not surface) of the maraging steel parts was applied. The average value is an average of these measurement points.

DETAILED DESCRIPTION

Example 1

Steel parts made of maraging steel 1.2709 in the form of a cylinder were provided together with cemented carbide parts with a composition of 10 wt % Co, 1 wt % other carbides and the remaining WC. The maraging steel had a hardness of approx. 340 HV1 prior to brazing.

Onto a part of the maraging steel parts a Ni coating was deposited using arc PVD (physical vapor deposition). The samples were first ion etched (100 A, 1,000 V bias voltage, 3 Ah) and then the Ni coating was deposited using 90 A, 30V bias voltage and 90 Ah until a thickness of 5 µm was reached.

The filler material was provided in the form of a foil with a thickness of 100 µm. The composition of the filler material was 100% Cu.

The foil was placed between the maraging steel part and the cemented carbide part so that both pieces were in contact with the foil. The assembled joining pieces were then placed into a Schmetz vacuum furnace where the temperature was first increased to 650° C. at a rate of 20° C./min and kept there for 10 minutes. The pieces were then heated up to 850° C. at a rate of 20° C./min and kept there for 10 minutes. After that, the temperature was increased up to the brazing temperature of 1100° C. at a rate of 5° C./min. The brazing temperature 1100° C. was kept for 15 minutes after which the pieces were cooled down to 300° C. at a rate of 5° C./min. After 300° C. it was free cooling.

After the brazing step, the brazed pieces were subjected to an aging process to increase the hardness of the maraging steel. The pieces were placed in the same furnace as the brazing where the temperature was increased to the aging temperature at a rate of 5° C./min. The aging temperature 580° C. was kept for 3 h after which the pieces were cooled down to 300° C. at a rate of 5° C./min. After 300° C. it was free cooling.

The joined pieces where the maraging steel has been provided with a Ni coating is herein called Invention 1 whereas the joined pieces where the maraging steel was not provided with a Ni coating is herein called Comparative 1.

Figure 2:
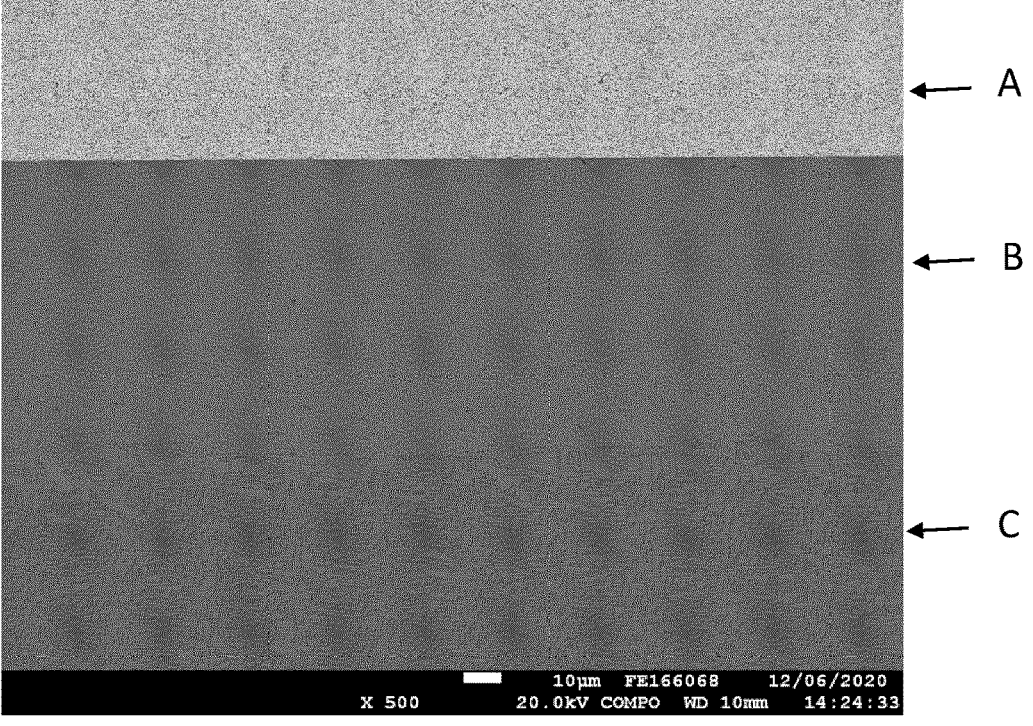
FIG. 2 shows a SEM image of a braze joint according to the present invention where a Ni coating was deposited onto the steel joining partner prior to brazing where A is the cemented carbide joining member B is the brazing joint and C is the maraging steel joining member.
Figure 3:
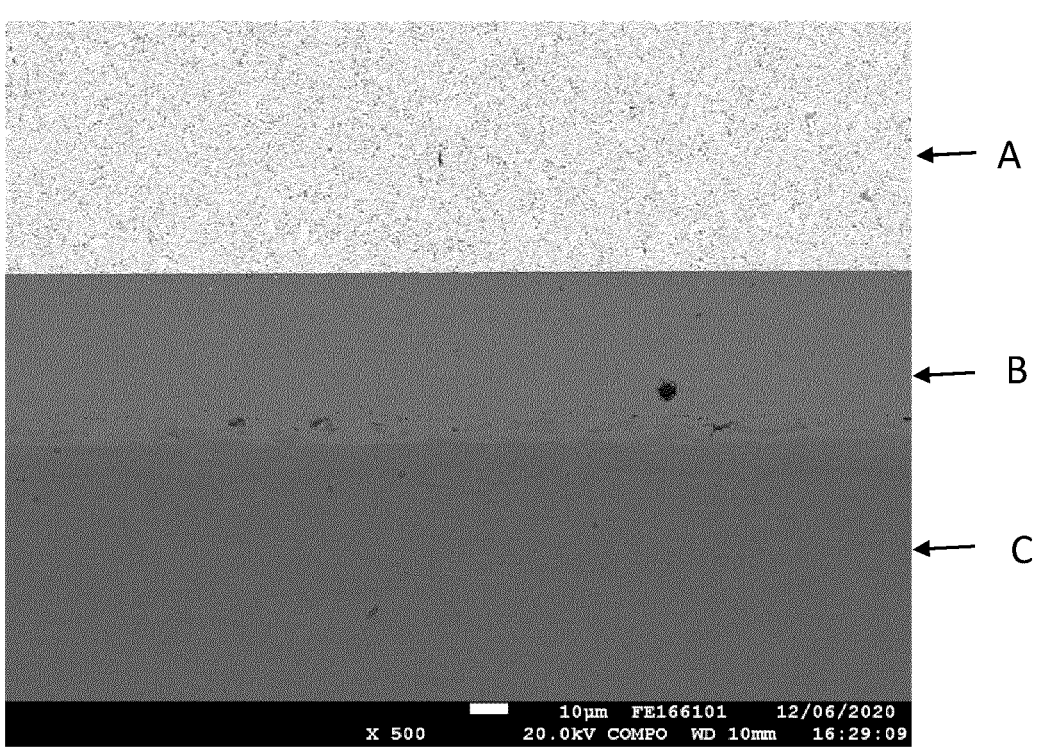
FIG. 3 shows a SEM image of a braze joint according to prior art where no Ni coating was deposited onto the steel joining partner prior to brazing where A is the cemented carbide joining member B is the brazing joint and C is the maraging steel joining member.

A SEM image of the braze joint of Invention 1 is shown in FIG. 2 and a SEM image of the braze joint of Comparative 1 is shown in FIG. 3. As can be seen in FIG. 3, the braze joint contains some irregularities and defects closest to the steel part.

An excellent wetting with no signs of thermal stress crack could be observed, proven by the high shear test result.

Example 2 (Comparative)

A steel part made of the carbon-hardening hot-work steel 1.2344 was provided together with a cemented carbide part with a composition of 10 wt % Co, 1 wt % other carbides and the remaining WC.

The filler material was provided in the form of a foil with a thickness of 100 μm. The braze metal had a composition of 100.0 wt % Cu. The melting temperature is 1085° C.

The foil was placed between the maraging steel part and the cemented carbide part and assembled joining pieces were placed into the furnace where the temperature was first increased to 650° C. at a rate of 20° C./min and hold for 5 minutes. From 650° C. the temperature was then increase by a rate of 10 K/min to the brazing temperature $T_{Brazing}$, which was 1100° C. $T_{Brazing}$ was kept for a dwell time of 15 min, after which the pieces were cooled down to 850° C. with a cooling rate of 50 K/min. From 850° C., the specimens were N$_2$-quenched with an overpressure of 2 bars and a fan frequency of 2500 min$^{-1}$.

Subsequently, the cemented carbide-steel joint with the carbon-hardening hot-work steel 1.2344 was aged at 630° C. for 2 h two times.

The sample will herein be denoted Comparative 2.

Example 3

Figure 1:
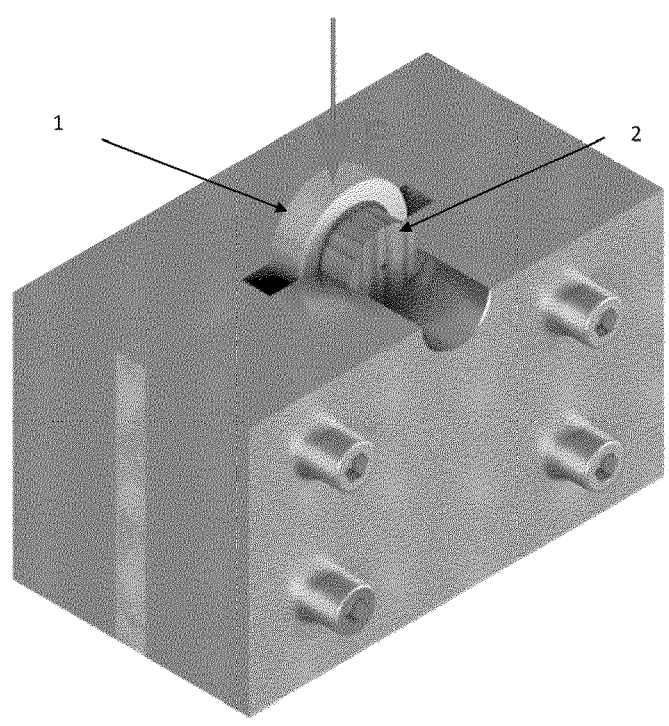
FIG. 1 shows a schematic drawing of the shearing test device where 1 is the steel joining member and 2 is the cemented carbide joining member.

The joined pieces were evaluated by measuring the shear strength of the brazed joint, the hardness of the maraging steel part and the braze joint were investigated for cracks etc. In order to assess the joint strength properties, the samples were shear tested using a shear device set-up as shown in FIG. 1 where 1 is the steel part in the shape of a steel cylinder (Ø=20 mm, h=5 mm) and 2 is the cemented carbide part in the shape of a cemented carbide cylinder (Ø=10 mm, h=5 mm. The steel cylinder is positioned in the gap of the shear strength test device and therefore can only be moved in loading direction. A notch, which was eroded into the surface of the device, holds the joined parts in the right position and guarantees an evenly distributed force induction into the braze joint. The applied force was constantly increased until the braze joint failed and the cemented carbide cylinder sheared off. The ultimate shear strength was then calculated by the quotient of the maximal measured force and the initial joining surface (A=78.5 mm$^2$). The filler material was not removed before the determination of brazed joint shear strength. When a rod was tested, the same method was applied.

The hardness of the steel parts was measured by a Vickers hardness tester on a cross section of the maraging steel part, applying a load of 1 kgf (kilogram force) and a loading time of 15 s. A pattern of 3×6 indents covering the complete profile (ca. 20×5 mm$^2$) of the of the steel part in the cross-section was applied.

TABLE 1

| | Shear strength (MPa) | Hardness (HV1) |
|---|---|---|
| Invention 1 | 327 | 427 |
| Comparative 1 | 152 | 427 |
| Comparative 2 | 17.1 | 494 |

The invention claimed is:

1. A method of making a tool by joining a cemented carbide joining partner with a maraging steel joining partner, the method comprising the steps of:

applying a Ni coating with a thickness of between 0.5 and 15 μm on a joining surface of the maraging steel joining partner;

placing a filler material including at least 70 wt % Cu between the cemented carbide joining partner and the Ni coated joining surface of the maraging steel joining partner;

subjecting the cemented carbide joining partner and the maraging joining partner with the filler material in between to a brazing process at an elevated temperature in a vacuum furnace at a temperature between 90° and 1200° C., for a time period of between 1 and 60 minutes; and subjecting the joined cemented carbide joining partner and maraging joining partner to a tempering process at a temperature of between 30° and 600° C. for between 5 minutes and 12 hours.

2. The method according to claim 1, wherein the filler material includes at least 99 wt % Cu.

3. The method according to claim 1, wherein the Ni coating has a thickness of between 2 and 10 μm and is deposited using a PVD technique.

4. The method according to claim 1, wherein the maraging steel comprises 8 to 25 wt % Ni, one or more alloying elements selected from Co, Mo, Ti, Al and Cr in a total amount of between 7 to 27 wt %, less than 0.03 wt % C and a balance of Fe and impurities.

5. The method according to claim 1, wherein the maraging steel comprises 11 to 25 wt % Ni, 7 to 15 wt % Co, from 3 to 10 wt % Mo, 0.1 to 1.6 wt % Ti, from 0 to 0.15 wt % Cr, from 0 to 0.2 wt % Al, and less than 0.03 wt % C with a balance of Fe and impurities.

6. The method according to claim 1, wherein the maraging steel comprises 15 to 25 wt % Ni, 8.5 to 12.5 wt % Co, from 3 to 6 wt % Mo, 0.5 to 1.2 wt % Ti, from 0 to 0.15 wt % Cr, from 0 to 0.2 wt % Al, less than 0.03 wt % C with a balance of Fe and impurities.

7. The method according to claim 1, wherein the brazing process takes place at a temperature of between 95° and 1170° C. for between 5 and 30 minutes.

8. The method according to claim 1, wherein the tempering process takes place at a temperature of between 400 and 600° C. for between 2 and 5 hours.

* * * * *